United States Patent
Qawami et al.

(10) Patent No.: US 8,375,189 B2
(45) Date of Patent: Feb. 12, 2013

(54) CONFIGURING LEVELS OF PROGRAM/ERASE PROTECTION IN FLASH DEVICES

(75) Inventors: Shekoufeh Qawami, El Dorado Hills, CA (US); Joel T. Jorgensen, Colorado Springs, CO (US); Geoffrey A. Gould, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 859 days.

(21) Appl. No.: 11/322,680

(22) Filed: Dec. 30, 2005

(65) Prior Publication Data

US 2007/0157000 A1    Jul. 5, 2007

(51) Int. Cl.
    *G06F 12/14*    (2006.01)
(52) U.S. Cl. ................................ 711/170; 711/163
(58) Field of Classification Search .................. 711/163, 711/170
    See application file for complete search history.

(56) References Cited

U.S. PATENT DOCUMENTS

| | | | |
|---|---|---|---|
| 5,592,641 A * | 1/1997 | Fandrich et al. | 711/103 |
| 5,749,088 A * | 5/1998 | Brown et al. | 711/115 |
| 5,937,423 A | 8/1999 | Robinson | |
| 5,954,818 A | 9/1999 | Dalvi et al. | |
| 6,026,016 A | 2/2000 | Gafken | |
| 6,035,401 A * | 3/2000 | Dalvi et al. | 714/746 |
| 6,073,243 A | 6/2000 | Dalvi et al. | |
| 6,154,819 A * | 11/2000 | Larsen et al. | 711/163 |
| 6,209,069 B1 | 3/2001 | Baltar | |
| 6,446,179 B2 | 9/2002 | Baltar | |
| 6,615,329 B2 * | 9/2003 | Scott et al. | 711/163 |
| 6,633,964 B2 * | 10/2003 | Zimmer et al. | 711/163 |
| 6,731,536 B1 * | 5/2004 | McClain et al. | 365/185.04 |
| 6,842,371 B2 * | 1/2005 | Liu | 365/185.04 |
| 7,155,589 B2 * | 12/2006 | Chevallier et al. | 711/163 |
| 7,890,721 B2 * | 2/2011 | Lee | 711/163 |
| 8,041,912 B2 * | 10/2011 | Kuo et al. | 711/163 |
| 2006/0071646 A1 | 4/2006 | Paillet et al. | |
| 2006/0107320 A1 | 5/2006 | Bhatt et al. | |
| 2006/0136755 A1 | 6/2006 | Qawami et al. | |
| 2006/0139995 A1 | 6/2006 | Keshavarzi et al. | |

OTHER PUBLICATIONS

Tanenbaum, A. S. Structured Computer Organization. 1984. Prentice Hall Inc. 2nd ed. pp. 10-12.*
Schrom, et al. "Memory Cell Driver Circuits," U.S. Appl. No. 11/169,106, filed Jun. 27, 2005.
Qawami, et al. "Use of Flash Memory Blocks Outside of the Main Flash Memory Array," U.S. Appl. No. 11/317,951, filed Dec. 22, 2005.

* cited by examiner

*Primary Examiner* — Yaima Campos
*Assistant Examiner* — Samuel Dillon
(74) *Attorney, Agent, or Firm* — Christopher K. Gagne

(57) ABSTRACT

A method and apparatus for configuring a memory device, such as a flash memory device, is herein described. Features/functional modules of a memory device, are selectable by a manufacturer, customer, or user. Instead of a manufacturer having to complete numerous redesigns of a memory product to meet multiple customer's special needs, a single all inclusive device is manufactured and the customized features are selected/configured, by the manufacturer, or by the customer themselves. By using one time programmable (OTP) flags, the features are enabled or disabled, by the manufacturer, customer, or user, and may potentially not be altered by a user later. Moreover, after configuring a memory device, a manufacturer, customer, or end user may also lock down a configuration module to ensure the configuration itself is not later intentionally or inadvertently altered.

29 Claims, 5 Drawing Sheets

Select a register in a memory device, wherein the register includes a plurality of flags
405

Program the plurality of flags in the register to select a configuration of features in the memory device
410

FIG. 4

CONFIGURING LEVELS OF PROGRAM/ERASE PROTECTION IN FLASH DEVICES

FIELD

This invention relates to the field of memory devices and, in particular, to configuring memory devices including different levels of program/erase protection.

BACKGROUND

Non-volatile memories, such as flash EPROM (erasable programmable read-only memory) devices have developed into a popular source of memory in a wide range of digital applications. Flash memory devices typically allow for high memory densities, high reliability, and low power consumption. These characteristics have made flash memory very popular for low power applications, such as embedded memory circuits. Common uses of non-volatile memory include portable computers, personal digital assistant (PDA) devices, digital cameras, cellular telephones, TV boxes, routers, copy machines, and any number of other consumer products. In these devices, both program code and system data, such as configuration parameters and other firmware, are often stored in flash memory, because of the compact storage and relative ease of software upgradeability.

Non-volatile memories are also often used in computer systems to store modular and upgradeable information, such as basic input/output software (BIOS), so pieces of the platform may be updated without having to frequently replace components in the system. With flash memory devices, operations, such as erasing stored code or data are often performed in blocks instead of on a bit-by-bit basis. However, programming may generally be performed one bit, one byte or one word at a time. The use of flash memory to store upgradeable data has necessitated the development of mechanisms to protect the data from unintended erasure or reprogramming.

To ensure the integrity of block-based flash memory, block protection schemes are needed to protect stored data when the memory is modified through program or erase operations. For example, critical system code, such as boot code, may be stored in a lockable "boot block" of the device, while other blocks are allocated to other portions of code or data. Some original equipment manufacturers (OEMs) and other purchasers of non-volatile memory want to protect areas of flash pre-programmed from access by users. As a consequence, permanent locking mechanisms have been implemented to be programmed once to lock access to blocks in a flash device. However, with the frequency of hardware and software updates in the industry today, other features, such as temporary locking have been implemented.

Yet, to meet different customer's demands of different configurations of enabled features, non-volatile memory manufacturers repeatedly have to re-design and re-manufacture parts, which is potentially expensive and time consuming. Providing diverse features to a number of customers with conflicting requirements has required maintaining excessive inventory and shipment tracking systems, and threatens the value of product returned for refund.

BRIEF DESCRIPTION OF THE DRAWINGS

The present invention is illustrated by way of example and not intended to be limited by the figures of the accompanying drawings.

FIG. 4 illustrates an embodiment of a flow diagram for programming a register in a memory device to select a configuration of features in the memory device.

DETAILED DESCRIPTION

In the following description, numerous specific details are set forth such as examples of specific types of flash memory, features of flash devices, and implementations of flash, etc. in order to provide a thorough understanding of the present invention. It will be apparent, however, to one skilled in the art that these specific details need not be employed to practice the present invention. In other instances, well known components or methods, such as the manufacture of flash devices, locking mechanisms, and other flash features, have not been described in detail in order to avoid unnecessarily obscuring the present invention.

The method and apparatus described herein are for configuring non-volatile memory devices, which may be implemented in any computer, embedded or other system. However, the configuring of features is not so limited, as the method and apparatus may be implemented in other memory devices and integrated circuits, such as volatile memory.

Memory Devices

Figure 1:
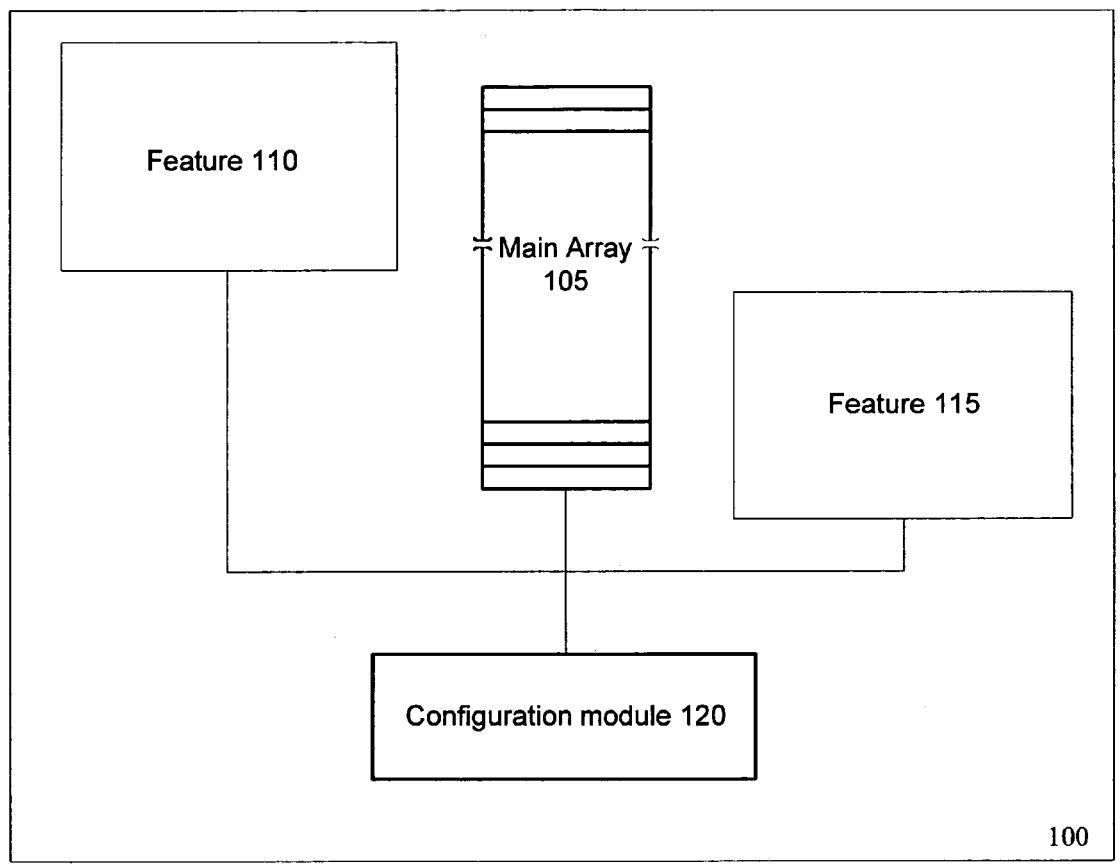
FIG. 1 illustrates an embodiment of a memory device including a configuration module.

Turning to FIG. 1, an embodiment of a memory device 100 is illustrated. Memory device 100 includes any device for storing data elements, instructions, code, logical values, or other information. In one embodiment, memory device 100 is a non-volatile memory device.

As a specific example of non-volatile memory, memory device 100 is an erasable programmable read-only memory (EPROM). An EPROM and an electrically erasable PROM or EEPROM device is often referred to as a flash device, since the device is "flashed" or electrically erased/programmed. The two common types of flash memory include NOR and NAND flash memory, which refers to the types of transistors and memory array physical organization used in the device. Both types of flash memory store information in an array of transistors, which are referred to as cells. Traditionally, each cell stores 1-bit of information per cell; however, multi-bit cells are also currently used to store multiple bits per cell of a flash device. The operation of programming a flash device is discussed in more detail in reference to main array 105.

In another embodiment, memory device 100 is a random access memory (RAM), such as a static RAM (SRAM) or dynamic RAM (DRAM), device. Unlike a non-volatile memory, a RAM device does not usually store values, when no power is supplied to the device. Examples of common RAM devices include, double-data rate (DDR) RAM, synchronous DRAM (SDRAM), non-synchronous DRAM, pseudo-SDRAM (PSRAM) and extended data out DRAM (EDO RAM).

As yet other examples, memory device 100 is a read only memory (ROM), a long-term storage drive, a hard drive, or other memory device. Although device 100 is discussed as a memory device in order to illustrate configuring features on device 100, device 100 is not so limited. As an example, device 100 may include any integrated circuit, such as a processor, micro-controller, embedded device, controller hub, video device, audio device, or other integrated circuit.

Main Array and Blocks/Sectors of Memory

A memory device, such as device 100, typically includes an array, such as main array 105, to store the data, code, elements, logical values, and other information. Main array 105 may be physically or logically organized in any manner including a single dimensional array, a multiple dimensional array, or a plurality of random memory elements, as well as being physically partitioned or virtually partitioned to use different parts of one array for multiple uses or features.

In one embodiment, memory 100 is a flash device, where main array 105 is organized into blocks/segments. As an example, assume memory 100 is a NOR flash device. A NOR flash cell is typically set to a specified data value by starting up electrons flowing from the source to the drain and applying a large voltage placed on a control gate, which provides a strong enough electric field to accumulate some electrons on a floating gate, a process called hot-electron injection.

To erase a NOR flash cell, which is commonly done by resetting a cell to a logically high voltage, i.e. a 1 or high logic value, a large voltage differential is placed between the control gate and source, which pulls electrons off the floating gate. Most modern main memory arrays in flash devices are divided into erase segments, usually called either blocks, segments or sectors. Through operation of the erase procedure, a full block, segment or sector is erased. NOR programming, however, can generally be performed one byte or word at a time. NAND flash devices work on similar principles and are also often organized in sectors, segments or blocks. The specific implementations, operation, and manufacture of NOR and NAND flash is not described herein in detail to avoid obscuring the invention, as both types of flash are extremely well-known in the art.

Often, the use of logic levels or logical values is also referred to as 1's and 0's, which simply represents binary logic states. For example, a 1 refers to a high logic level and 0 refers to a low logic level. In many older systems a high logic level was represented by a voltage, e.g. 5V, and a low logic level was represented by a different voltage, e.g. 0V. As another specific example, a high logic level is at 1.2V and a low logic level is at 0.3V. However, a high logic/voltage level may refer to any voltage level above a threshold value, and inversely, a low logic/voltage level may refer to any voltage level below the threshold value. In addition, there may be more than two logical levels in a cell or waveform. As an example, a single waveform may represent four different logical values at different voltage levels.

In another embodiment, where memory device 100 is a RAM or other integrated circuit device, a block/segment is viewed as any single location or grouping of memory locations. For example, in a RAM a single addressed memory location is a block. Or, in a RAM that is logically viewed in pages, a full page or other grouping is considered a block of memory.

Features/Functional Modules

FIG. 1 also illustrates features 110 and 115, which also may be referred to as functional modules, feature modules, or other modules. A module may be implemented in hardware, software, firmware, or any combination thereof. Commonly, module boundaries vary and functions are implemented together, as well as separately in different embodiments. As an example, which is discussed in more detail below, a locking module is implemented using a section of main array 105 or separate memory array in conjunction with microcode implemented in firmware and logic associated with locking portions of main memory array 105. In this example, the locking module includes the firmware, software (microcode), array hardware, and other logic, which crosses the boundaries of the main array, the firmware, the software, and individual locking logic.

A feature, such as features 110 and 115, include any module for performing a function in or for memory 100. Examples of features include a permanent block lock array, a temporary block lock array, a one time programmable (OTP) block lock array, an erasable block lock array, a high voltage override module, a manufacturer protection module, a charge pump module, a firmware module, an input/output module, a processing module, and an execution module. Charge pumps, firmware, and processing units, such as embedded controllers, are potential components of a memory device. Block lock arrays, manufacturer's protection modules, and high voltage override modules are also potential components, which are discussed in more detail in reference to FIG. 2.

Examples of functions performed in the memory device by the aforementioned modules include permanently locking a block of main memory array 105, temporarily locking a block of main memory array 105, locking a block of main memory array 105 based on corresponding one time programmable (OTP) bits, locking a block of main memory array 105 based on corresponding erasable lock bits, overriding a functional module based on an input signal, locking a section of a protection register to store manufacturer settings, receiving data, transmitting data, executing instructions/code, operating on data, supplying current/voltage, programming values, and storing data. The foregoing examples are specific examples to illustrate possible functions in memory device 100, however, any known function in a memory device, such as accessing memory locations, writing to locations, parity of memory, or other function, may also be performed.

Figure 2:
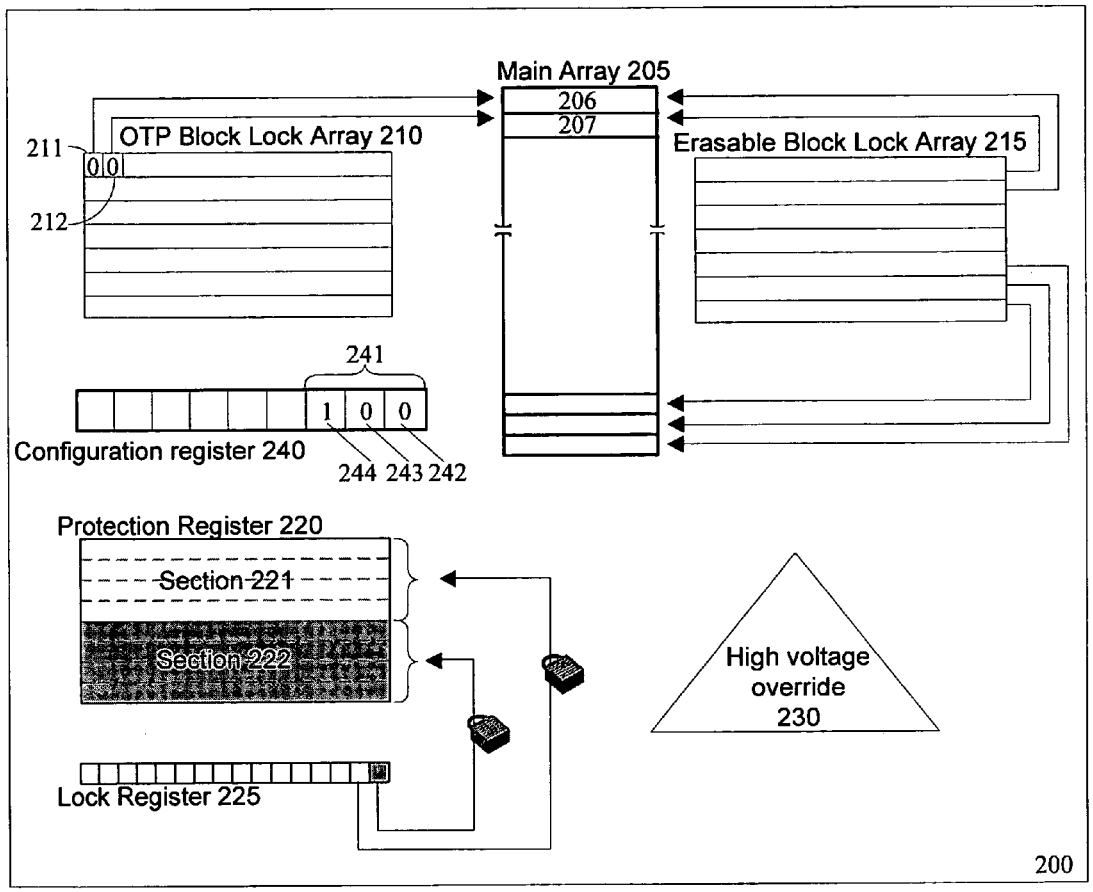
FIG. 2 illustrates an embodiment of a memory device including a configuration register.

Turning to FIG. 2, an embodiment of a memory device is illustrated. As stated above, memory 200 may be any type of memory device. However, to simplify the example and illustrate configuring features of a memory device, memory device 200 will be discussed as a flash memory or non-volatile memory, i.e. flash 200. Flash 200 includes main array 205, one time programmable (OTP) block lock array 210, erasable block lock array 215, protection register 220, lock register 225, high voltage override module 230, and configuration register 240.

OTP block lock array 210, which may also be referred to as a permanent block locking array, is used to lock access to blocks or segments of main array 205. When updating or erasing information in main array 205 it is potentially advantageous to be able to lock other blocks of memory to protect from accidental or intentional erasure. In other cases, vital or important information, such as boot code, is able to be protected by locking write/programming access to those locations. For example, a customer, that wants to store code to be protected from alteration by users, stores the code and locks write/erase access to those segments in main array 205. Here, users are able to read from the blocks, but are not able to write or erase the protected blocks.

Therefore, locking of a cell, bit, or location includes any different level of denying access to a segment, block or location including not allowing a write, an erase, a read, or any combination thereof to a segment, block or location. Locking may be accomplished through a module. Examples of components of a locking module, include an OTP block lock array, an erasable block lock array, a permanent block lock array, a temporary block lock array, firmware, microcode, software, Boolean logic, and other logic or hardware.

In one embodiment, firmware associates bits of a lock array with corresponding blocks in main memory. In another embodiment on-chip flash microcode associates bits of a lock array with corresponding blocks in main memory. In that case, upon an attempted write/erase to a block, microcode executed on chip reads the value of a bit or bits corresponding to the block to be accessed, and denies a write/erase, if the value of the bit or bits represents a locked block. In another embodiment, hardware is used to read bits from a lock array and physically allow or deny writes/erases to a corresponding block of a main array.

A useful feature for performing locking of blocks in main array 205 is OTP block lock array 210. Array 210 through use of one time programmable bits, which refers to bits that may be programmed but typically are not erasable, allowing for permanent locking of segments or blocks of main array 205. Assume that array 210 initializes all values to a high logic value, i.e. a 1, which represents that corresponding blocks are enabled. Consequently, a write of a 0, or low logic value, to bit/cell 211 locks corresponding block 206. Similarly, if a 0 is written to bit 212, segment 207 is locked. As stated above, feature 210 allows for a circuit manufacturer, system manufacturer, customer, or even user to store code/data in main array 205 and then permanently lock the segment containing that code/data to prevent writing, programming, and erasing by another party.

Note that above, specific references to 1's enabling blocks and 0's disabling/locking blocks is purely illustrative, and the inverse where 0's enable and 1's lock may be used. Furthermore, OTP block lock array 210 illustrates each bit in the array corresponding to a block/segment of main array 205, but any single, combination or grouping of bits may correspond with any single, combination, or grouping of blocks, locations, or segments in main array 205.

Extremely similar in operation to OTP block lock array 210, is erasable block lock array 215. Array 215 includes bits or locations corresponding to blocks in main array 205 to lock the corresponding blocks. However, array 215, in contrast to array 210, uses bits that are erasable and reprogrammable. For example, if a user stores code that they want to protect during a first operation and then unlock during a second operation, array 215 is used to temporarily lock a block. As a result, during the first operation a bit/bits in array 215 is/are set to a first value to lock a block, and then upon the second operation the bit/bits is/are set to a second value to allow writes/erases. Because of the ability to erase and reprogram array 215, unlike OTP bits in array 210, erasable block lock array 215 is also referred to as a temporary block lock array.

Either OTP block lock array 210 or erasable block lock array 215 individually or in combination may be present in a functional/locking module, as well as other firmware, software, or hardware used for locking a block of main array 205. In one embodiment the arrays used for OTP block lock array 210 and erasable block lock array 215 are physically separate from each other and main array 205. However, in an alternate embodiment, array 210 and 215 are physically in the same array. As a specific example, array 210 and 215 are physically part of main array 205, but logically partitioned and mapped into separate arrays used to perform the functions of array 210 and 215.

Other exemplary features illustrated in FIG. 2 include high voltage override 230 and manufacturer/user protection logic 220 and 225. In one embodiment, high voltage override module 230 is used to override other functional units in flash 200 based on an input signal. For example, a threshold voltage is supplied or generated by high voltage override module 230, and when an input signal is received with a voltage greater than that threshold, a functional unit in flash 200 is overridden, disabled, activated, or enabled.

To illustrate, assume that a customer has programmed some of the bits in OTP block lock array 210, having some blocks locked and some blocks unlocked. Since array 210, includes OTP bits, the locked blocks stay permanently locked. However, if a customer has enabled high voltage override, then providing a high voltage signal potentially overrides OTP block lock array 210, which allows the customer or user to alter contents of main array 205. Other features, such as erasable block lock array 215, protection logic 220 and 225, and the other functional modules mentioned above may be overridden by high voltage override module 230 in a similar manner.

Protection register 220 and 225 are separate tools for manufacturers/customers to potentially store some data or code and lock that section, while allowing a customer to do the same. As an example, manufacturer information or code is stored in section 222 before shipping to a customer. In register 225, section 222 is potentially locked, so that customers and end users do not alter the stored information. In addition, section 221 is available to a customer for storing code and protecting it from end users in a very similar manner.

Other protection mechanisms and storage may be used to store important manufacturer or customer specific information or code. Moreover, any number of other features known for being associated with memory devices, or specifically flash memory devices, may also be implemented in memory 200, as well as configured, which is discussed below.

Configuring Functional Modules/Features

Referring back to FIG. 1, a configuration module 120 is illustrated. Configuration module 120 may be implemented in hardware, software, firmware, or any combination thereof, as well as being implemented across boundaries of other features, modules, and units in device 100. Configuration module 120 is to configure a functional module, feature, unit, or other component associated with memory device 100. Configuration may include enabling, disabling, locking down, changing the size of, changing the power delivered to, changing the function of, or altering the operation of a functional module, feature, or unit.

Turning once again to FIG. 2, in a first embodiment, configuring memory device 200 or a feature/functional module in memory device 200 includes enabling or disabling a functional module. For example, configuring OTP block lock array 210 includes disabling OTP block lock array 210, or alternatively, enabling OTP block lock array 210. The result of giving the customer the ability to enable and disable functional modules and features is readily seen, as the manufacturer produces only one memory device with any number of features. Upon manufacture or later, either the manufacturer or customer selects a configuration of enabled or disabled features, based on their preferences, instead of having the manufacturer redesign a new component. Because of this ability to selectively enable and disable features/units, configuration module 120 may also be referred to as a selection module.

Configuration/selection module 120 may be implemented in hardware, software, firmware, logic, or any combination thereof. One embodiment of a component in a configuration module is illustrated in FIG. 2, i.e. configuration register/storage element 240. Configuration register 240 is to store values or bits that a configuration of memory device 200 is based on. As an example, configuration register 240 stores flags 241, which are also referred to as configuration flags. A flag is a bit, group of bits, or variable during execution to represent a configuration of a module or feature. As a first example, configuration flags 241 are one time programmable (OTP) flags. In that case, flags 241 in storage element 240 are not erasable. Some of flags 241, for example flag 242, may be programmed by a memory manufacturer, then later, other flags, such as flag 244, may be programmed by a system manufacturer. Here, manufacturers or customers are able to enable or disable features once, which potentially allows for a permanent selection of enabled and disabled features on memory device 200.

As another illustrative example, features or modules, such as OTP block lock array 210, erasable block lock array 215, and high voltage override module 230, are enabled or disabled based on flags 241, or at least the values stored in flags 241. As an example, a 1, or high logical value, in bit/flag 244 represents that OTP block lock array 210 is enabled, while 0's in flags 243 and 242 represent that erasable block lock array 215 and high voltage override module 230 are disabled. Consequently, array 210 is enabled, if flag 244 represents or is a first value, such as a logical 1, and is disabled if flag 244 represents or is a second value, such as logical 0. Note that any value, not just the specific example above of 1's and 0's, may be used to enable/disable functional modules.

In one embodiment, the actual enabling and disabling of a feature/module in memory device 200 is done through a combination of firmware, software and hardware. The values to enable or disable features in memory device 200 are programmed/stored in configuration register 240. In this example, microcode embedded in firmware or code stored in other storage on memory device 200 is executed to initialize or utilize at least some features of memory device 200. For example, OTP block lock array 210 stores two 0's in cells 211 and 212; however, a section of the microcode or software actually denies the write/erase access to blocks 206 and 207 based on the values in cells 211 and 212 through a variable value, conditional statement, loop, semaphore, function or other programming construct.

Continuing the example, if flags 241 represent a value to disable a feature, such as flag 243 representing that erasable block lock array 215 be disabled, then the section of code to lock access to blocks within main array 205 based on the values in array 215 is skipped. Furthermore, code to initialize array 215 may also be skipped/jumped over. Examples of tools to skip code or not execute code include conditional statements, loops, semaphores, functions or other programming constructs. As a result, based on the values of flags 241 in configurations register 240, features or functional modules are effectively disabled by jumping over code during execution to perform the function of the features or modules. Conversely, if flags 241 represent that a feature/module is enabled, the corresponding code sections are executed based on flags 241.

However, the above embodiment is merely exemplary, as features/modules may be enabled/disabled in any manner. For example, hardware or logic directly disables a feature or module based on flags 241, which potentially includes reducing or eliminating power supplied to the module, gating clocks supplied to the module, resetting all the values in a lock array to an enable value, or other hardware method for disabling the function of the module in memory device 200.

In another embodiment, configuring features/modules in memory device 200 includes locking down features or modules. As an example, assume that a customer has programmed a portion of the OTP block lock array 210's OTP bits and does not want to allow any further programming of OTP bits in array 210. In this case, OTP block lock array 210 is configured by locking down, i.e. not allowing further changes to, array 210 based on a flag stored in configuration register 240.

Another illustrative example includes configuring module 120 from FIG. 1 and/or register 240 in FIG. 2 by locking them down. Here, a customer is able to select certain features to be enable, disable, or lock down, and then is able to lock down configuration register 240 itself. As a consequence, a user or later customer is not able to alter the configuration of memory device 200, as configuration register 240 is locked down.

In yet another embodiment of configuring memory device 200, configuring includes changing a function of a feature. For example, erasable block lock array 215 is temporary, in that the lock bits in array 215 are erasable. However, the function of array 215 is changed by locking down array 215 based on flag bits in configuration register 240 to emulate the function of OTP block lock array 210. In another case, the function of high voltage override module 230 is changed.

Assume that high voltage override module 230 takes a high voltage input and overrides array 215 by default. A single bit or grouping of bits, such as two flag bits, in configuration register 240 are used to configure/change the function of module 230. Where two bits are used, four functions of four different features may be selected between to be overridden based on 2 bits. Examples of configuring module 230 to override a different function include changing module 230 to override: (1) array 210, (2) a lock of array 210 or 215 based on configuration register 240, (3) a lock down of configuration register 240, or (4) any other known function in a memory device.

An Embodiment of a System Including a Memory Device

Figure 3:
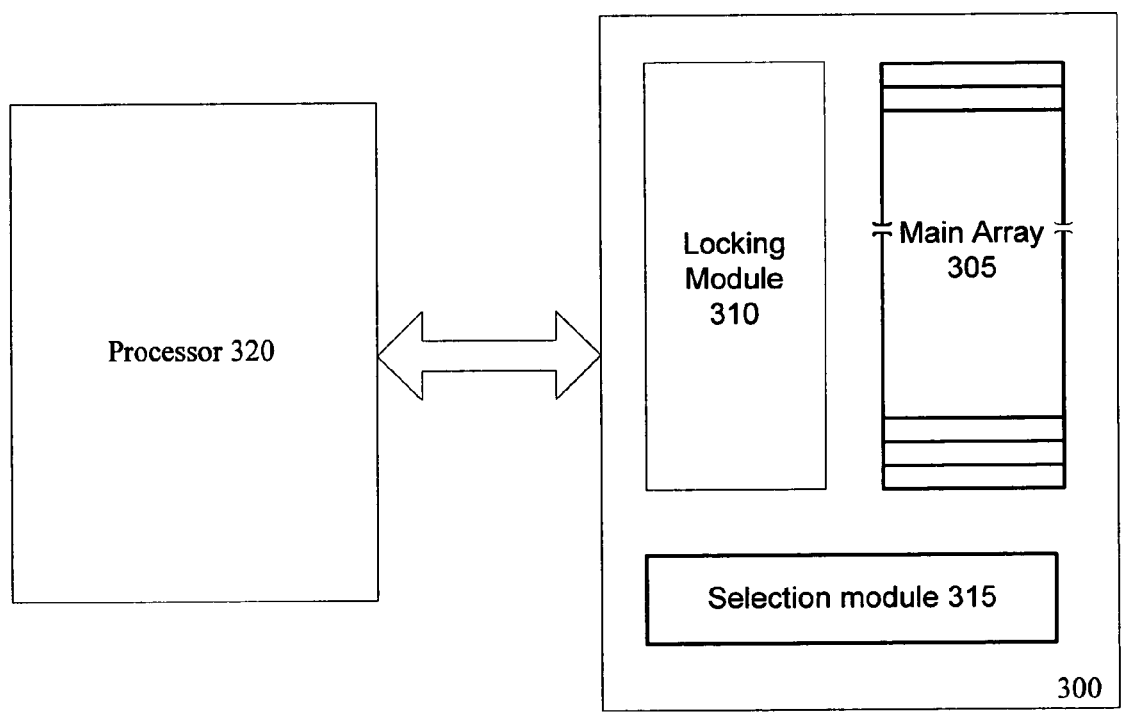
FIG. 3 illustrates an embodiment of a system including a processor coupled to a memory device having a selection module.

Referring next to FIG. 3 an embodiment of a system including memory device 300 and a processor 320 is shown. Memory device 300 may be any memory device, such as a non-volatile memory, a flash memory, a NOR flash memory, a NAND flash memory, a RAM, or a ROM. Memory device 300 includes locking module 310, main array 305, and selection module 315. Main array 305 includes a plurality of segments and is used to store code, data, instructions, boot-software, or other elements commonly stored in memory.

Locking module 310 is a module for protecting/locking segments/blocks of main array 305. In one embodiment, locking consists of protecting a segment from writes and erases. However, reads to a locked segment are allowed. In yet another embodiment, locking also includes blocking reads to locked segments, unless a specific user level read is detected or a high voltage override signal is detected. As a specific example, locking module 310 is a one time programmable (OTP) segment lock array or a permanent segment lock array. As another example, locking module 310 is an erasable segment lock array, temporary segment lock array, or semi-permanent segment lock array. In one embodiment, locking module 310 is physically implemented in memory array hardware and in microcode embedded in firmware. Yet, locking module 310 is not so limited, as it may be implemented purely in hardware, software, code, or firmware, as well as a combination thereof.

Memory device 300, as illustrated, also includes selection module 315. Selection module 315 is to select a configuration of features on memory device 300. For example, selection module is to select if locking module 310 is to be enabled or disabled. In a first embodiment, selection module 315 is to disable locking module 310 based on a one time programmable (OTP) flag. Here, if the OTP flag has a first value then selection module 315 enables locking module 310. In contrast, if the OTP flag has a second value then selection module 315 disables locking module 310. As another example, all or part of locking module 310 is disabled. As stated above, selection module 315 may be implemented in any hardware, software, firmware, or logic. In an embodiment where locking module 310 protects segments in main array 305 at least partially based on executed microcode embedded in firmware, disabling locking module 310 potentially includes setting the OTP flag so that the microcode does not block access to any segments based on the values in locking module 310.

In one embodiment, the storing of OTP flags or bits is done in any storage element. As stated above, a configuration register is an example of a storage element. However, any element that stores logical values may be used. Also note, that only one feature, locking module 310, is illustrated. However, the other features and modules aforementioned may also be selected or deselected by selection module 315. This enables manufacturers, customers, users, or other people associated with memory devices to select a configuration of features in memory device 300 to tailor to their needs, without requiring custom remanufacturing or redesigning of memory device 300.

Coupled to memory device 300 is processor 320. Processor 320 is any execution resources for executing code/instructions or for operating on data stored in main array 305. Although, processor 320 is illustrated external to and electrically coupled to memory device 300, memory device 300 may include processor 320 or in combination with processor 320 include a microcontroller, embedded processor, firmware, or other execution resources. In one embodiment, processor 320 is a host microprocessor capable of parallel execution. Processor 320 may also be capable of out-of-order (OOO) execution, integer execution, floating point execution, speculative execution, transactional execution, branch prediction, or other common microprocessor or microcontroller functions.

An Embodiment of a Method for Selecting a Configuration Features in a Memory Device Turning to FIG. 4, an embodiment of a flow diagram for a method of configuring a memory device is illustrated. In flow 405, a storage element in a memory device is selected. Selecting a storage element in memory includes targeting, addressing, or otherwise selecting a storage element to be written to, read from, or operated on. The storage element includes a plurality of flags. In one embodiment, each flag is a single bit. Yet, each flag may also be a grouping of any number of bits. In another embodiment, each flag is a one time programmable (OTP) bit.

In flow 410, the plurality of flags in the storage element are programmed to select a configuration of functional modules in the memory device. Examples of the functional modules in the memory device include a permanent locking module, a temporary locking module, and a high voltage override module. However, all the features/modules discussed above may be included. As stated above, the flags in the storage element may be a bit, a group of bits, an OTP bit, a group of OTP bits, a variable, or any other logical value storing mechanism. Programming flow 410 may be implemented as a collection of smaller flows performed in a sequence.

In one embodiment, programming the plurality of OTP bits includes writing a value, such as a logical 1, to flags associated with functional modules to be enabled. In contrast, a second value, such as a logical 0, is written to flags associated with functional modules to be disabled. Note that by default functional modules may either be enabled or disabled. As a result, programming does not necessarily include writing to all the plurality of flags. For example, if a flag associated with an OTP block lock array is by default set to a logical 1 to enable the feature, a later selection by a customer to leave this functional module enabled may include not re-writing a logical high value to the flag, if it already contains a logical high value. It is also worth noting, in another embodiment, a logical low value enables, while a logical high value disables functional modules.

In yet another embodiment, after the programming of the storage element, the storage element is locked down. In that case, the storage element and functional modules enabled or disabled are not to be changed by users at a later time, unless an override feature is enabled to allow such an action. Note that the order of the flows illustrated in FIG. 5 may be rearranged.

An Embodiment of a Method for Enabling/Disabling a Feature of a Memory Device

Figure 5:
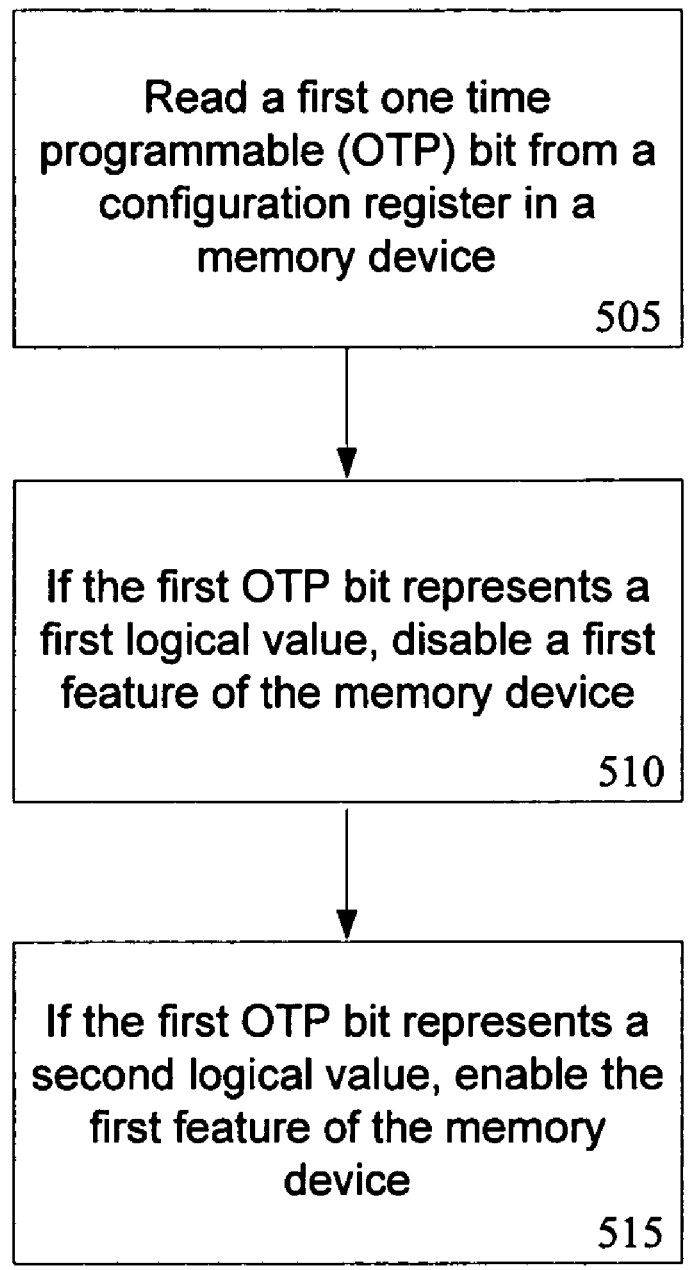
FIG. 5 illustrates an embodiment of a flow diagram for enabling or disabling a feature of a memory device based on a one time programmable (OTP) bit.

Referring to the last figure, FIG. 5, an embodiment of a flow diagram for a method of enabling or disabling a feature is illustrated. In flow 505, an OTP bit is read from a configuration register in a memory device. Reading a bit from a memory device is well-known and not discussed in detail here. However, any known method of reading a value from a storage element, such as a register, may be used to read the OTP bit from the configuration register.

In flow 510, a feature is disabled, if the OTP bit represent a first logical value. In one embodiment, the first logical value is a high logical value representing an disable value. Alternatively, the first logical value is a low logical value representing an disable value. As stated above, disabling a feature or functional module may be accomplished by any individual or combination of hardware, software, firmware, code, microcode, or logic.

As an example, assume microcode embedded in firmware or code stored in the memory device is executed to utilize the feature. In this situation, a section of the microcode or software may actually deny a write/erase access to corresponding blocks/segments of the memory device through use of a variable value, conditional statement, loop, semaphore, function or other programming construct.

Therefore, if the OTP bit represents a first logical value, then the section of code to lock access to blocks is jumped over, i.e. not executed or ignored. Examples of programming constructs to skip code or not execute code include conditional statements, loops, semaphores, and functions. As a result, the feature is effectively disabled by jumping over code which typically performs the function of the feature.

It logically follows that enabling a feature is extremely similar in operation. For example, assuming a conditional statement is used to jump code and disable the feature from above, then upon flipping the value in the OTP bit, the code section is entered and executed; essentially enabling the feature. Specifically, assume that the OTP bit originally had a logical low value of 0, where a conditional statement, such as if OTP_bit==1 then execute a code section to perform functions of a lock block array, is used. As a consequence, the code section is disabled, as the conditional statement is false and the code section is jumped over. However, if the OTP bit is flipped to a logical high value, i.e. a 1, then the feature is enabled and the execution path is allowed entrance into the section of code associated with the feature, as the conditional statement is now true.

As illustrated above, the features/functional modules of a memory device, such as a flash memory device, are selectable from a customer's perspective. Instead of a manufacturer having to complete numerous redesigns of a product to meet multiple customer's special needs, a single all inclusive device is manufactured and the customized features are configured by the customer themselves. In addition, a manufacturer may supply the part to customers with certain features enabled or disabled by default. Furthermore, a manufacturer may supply the part to customers without special configuration, to avoid maintaining separate inventory and shipment tracking before the customer selects and achieves his own desired configuration. By using OTP flags, the features are enabled or disabled by either a manufacturer, customer, or user, and then not alterable later by another party. Moreover, after configuring a memory device, a manufacturer, customer, or end user may also lock down the configuration module to ensure the configuration itself is not later intentionally or inadvertently altered.

In the foregoing specification, a detailed description has been given with reference to specific exemplary embodiments. It will, however, be evident that various modifications and changes may be made thereto without departing from the broader spirit and scope of the invention as set forth in the appended claims. The specification including the description with examples/embodiments and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
    a memory device including,
        a first memory array having a plurality of blocks;
        a plurality of functional modules coupled to the plurality of blocks, the plurality of functional modules being adapted to perform a plurality of different functions in the memory device, wherein at least one of the plurality of functional modules includes a lock array associated with the plurality of blocks; and
        a configuration module to configure the plurality of functional modules based on a plurality of configuration flags to be held in a configuration register separate from the first memory array and the lock array, wherein the configuration module is adapted to be configured to lock the configuration register to disallow subsequent modification of the plurality of configuration flags.

2. The apparatus of claim 1, wherein the memory device is a flash memory device.

3. The apparatus of claim 1, wherein the plurality of functional modules are each selected from a group consisting of a permanent block lock array, a temporary block lock array, a one time programmable (OTP) block lock array, an erasable block lock array, a high voltage override module, a manufacturer protection module, and an input/output module.

4. The apparatus of claim 1, wherein the plurality of different functions to be performed by the plurality of functional module is each individually selected from a group consisting of permanently locking at least one block of the plurality of blocks, temporarily locking at least one block of the plurality of blocks, locking at least one block of the plurality of blocks based on corresponding one time programmable (OTP) bits, locking at least one block of the plurality of blocks based on corresponding erasable lock bits, overriding a functional module based on an input signal, locking a section of a protection register to store manufacturer settings, receiving data, and transmitting data.

5. The apparatus of claim 1, wherein the configuration module is to lock the configuration register to disallow subsequent modification of the plurality of configuration flags in response to a first configuration flag of the plurality of configuration flags being set to a first value, and wherein the configuration module is to unlock the configuration register to allow subsequent modification of the plurality of configuration flags in response to the first configuration flag of the plurality of configuration flags being set to a second value.

6. The apparatus of claim 5, wherein the plurality of configuration flags include one time programmable bits.

7. The apparatus of claim 6, wherein configuring the plurality of functional modules comprises:
    enabling a functional module of the plurality of functional modules in response to a one time programmable bit corresponding to the functional module holding a first logical value, and
    disabling the functional module in response to the one time programmable bit holding a second logical value.

8. The apparatus of claim 1, wherein configuring the plurality of functional modules comprises locking a functional module of the plurality of functional modules in response to a configuration flag of the plurality of configuration flags corresponding to the functional module holding a first value, and unlocking access to the functional module in response to the configuration flag holding a second value.

9. The apparatus of claim 8, wherein the functional module is a block lock array having a plurality of lock bits, and wherein locking the block lock array comprises locking down the plurality of lock bits to prevent future programming of the plurality of lock bits.

10. An apparatus comprising:
    a first memory array including a plurality of blocks;
    a one time programmable (OTP) block lock array adapted to hold a plurality of OTP lock bits, wherein the OTP block lock array, when enabled, is adapted to lock blocks of the plurality of blocks based on corresponding OTP lock bits of the plurality of OTP lock bits;
    an erasable block lock array adapted to hold a plurality of erasable lock bits, wherein the erasable block lock array, when enabled, is adapted to lock blocks of the plurality of blocks based on corresponding erasable lock bits of the plurality of erasable lock bits;
    a high voltage override module, when enabled, adapted to override the OTP block lock array; and
    a storage element adapted to hold a plurality of configuration flags, and to be locked to disallow subsequent modification of at least some of the plurality of configuration flags, wherein the OTP block lock array is adapted to be enabled in response to a first flag of the plurality of configuration flags, which corresponds to the OTP block lock array, holding an enabled value, the erasable block lock array is adapted to be enabled in response to a second flag of the plurality of configuration flags, which corresponds to the erasable block lock array, holding the enabled value, and the high voltage override module is adapted to be enabled in response to a second flag of the plurality of configuration flags, which corresponds to the erasable block lock array, holding the enabled value.

11. The apparatus of claim 10, wherein the plurality of configurations flags are adapted to be locked down in response to a fourth flag of the plurality of configuration flags holding a locked value, and unlocked in response to the fourth flag of the plurality of configurations flags holding an unlocked value.

12. The apparatus of claim 11, wherein the storage element is a register, and wherein the OTP block lock array is adapted to be disabled in response to the first flag holding a disabled value.

13. The apparatus of claim 12, wherein the erasable block lock array is adapted to be disabled in response to the second flag holding the disabled value.

14. The apparatus of claim 13, further wherein the high voltage override module is adapted to be disabled in response to the third flag holding the disabled value.

15. A system comprising:
a memory device including
a main memory array having a plurality of memory segments,
an erasable locking module including a plurality of erasable lock bits, each of which when updated to a first value are to lock at least one of the plurality of memory segments in response to the erasable locking module being enabled;
a permanent locking module that is separate from the erasable locking module, the permanent locking module including a plurality of permanent lock bits that are not erasable, each of which when updated to a first value, are to lock at least one of the plurality of memory segments in response to the permanent locking module being enabled, and
a selection module including a first flag, when set to an enabled value, to enable the permanent locking module in the memory device and a second flag that is separate from the first flag, when set to the enabled value, to enable the erasable locking module in the memory device;
a processor coupled to the memory device to perform operations on data stored in the plurality of memory segments.

16. The system of claim 15, wherein the first and second flags include one time programmable (OTP) flags to be held in a configuration register.

17. The system of claim 16, wherein the permanent locking module includes an array of OTP bits, and wherein the first flag, when reset to a default value, is to disable use of the permanent locking module and the second flag, when reset to the default value, is to disable use of the erasable locking module.

18. The system of claim 17, wherein the selection module further includes a third OTP flag held in the configuration register, when set, to lock down the plurality of permanent lock bits from being modified, and wherein the third flag, when reset to a default value, is to allow one time modification of the permanent lock bits.

19. The system of claim 18, wherein the memory device further includes an additional feature module, and wherein the selection module is also to reconfigure the feature module based on at least a fourth OTP flag held in the configuration register.

20. The system of claim 19, wherein the feature module is selected from a group consisting of a high voltage override module, a configuration register lock down module, a permanent segment lock array lock down module, a temporary segment lock array lock down module, a processing module, and an execution module.

21. A non-transitory memory device including program code which, when executed by a machine, causes the machine to perform the operations of:
selecting a register in the memory device, wherein the register includes a plurality of flags, and wherein the memory device is to include a plurality of functional modules separate from and coupled to the register and a memory array including a plurality of blocks, the functional modules including at least one array of lock bits and a second functional module that does not include lock bits; and
programming the plurality of flags in the register to enable more than one of the plurality of functional modules for use in the memory device, wherein each of the functional modules are configured to be disabled based on a flag of the plurality of flags corresponding to each of the functional modules holding a disabled value.

22. The storage device of claim 21, wherein each of the plurality of functional modules in the memory device are selected from a group consisting of a permanent locking feature, a temporary locking feature, a high voltage override feature, and a protection register.

23. The storage device of claim 21, wherein the plurality of flags are a plurality of one time programmable (OTP) bits.

24. The storage device of claim 23, wherein programming the plurality of OTP bits comprises:
writing a first value to a first OTP bit of the plurality of OTP bits associated with a first functional module of the configuration of functional modules to be enabled; and
writing a second value to a second OTP bit of the plurality of OTP bits associated with a second functional module of the configuration of functional modules to be disabled.

25. The storage device of claim 21, further comprising: locking down the plurality of flags in the register, after programming.

26. A method comprising:
reading a plurality of one time programmable (OTP) flags from a configuration register in a memory device, wherein the OTP flags do not include lock-bits for a memory array in the memory device;
disabling a first feature of the memory device in response to a first OTP flag of the plurality of OTP flags, which corresponds to the first feature, holding a first value; and
enabling a second feature of the memory device in response to a second OTP flag of the plurality of OTP flags, which corresponds to the second feature, holding a second value, wherein the first and second features include features other than locking or unlocking blocks of a memory array in the memory device.

27. The method of claim 26, wherein disabling a first feature of the memory device in response to the first OTP flag holding a first value comprises:
jumping over a section of code associated with the first feature of the memory device in response to the first OTP flag holding the first value.

28. The method of claim 26, wherein enabling the second feature of the memory device in response to the second OTP flag holding a second value comprises:
allowing entrance into a section of code associated with the second feature of the memory device in response to the second OTP flag holding the second value.

29. The method of claim 26, wherein the first feature and the second feature, are each individually selected from a group consisting of a OTP block locking module, an erasable block locking module, a high voltage override module, a buffering module, a clocking module, a memory reconfiguration module, and an external communication module.

* * * * *